United States Patent [19]
Farrar

[11] Patent Number: 5,994,777
[45] Date of Patent: Nov. 30, 1999

[54] METHOD AND SUPPORT STRUCTURE FOR AIR BRIDGE WIRING OF AN INTEGRATED CIRCUIT

[75] Inventor: Paul A. Farrar, So. Burlington, Vt.

[73] Assignee: Micron Technology, Inc., Boise, Id.

[21] Appl. No.: 09/140,377

[22] Filed: Aug. 26, 1998

Related U.S. Application Data

[62] Division of application No. 08/954,450, Oct. 20, 1997, Pat. No. 5,891,797.

[51] Int. Cl.$^6$ ............................. H01L 29/04; H01L 21/28
[52] U.S. Cl. ......................... 257/758; 257/280; 257/522; 257/276; 257/379
[58] Field of Search ...................... 257/758, 503, 257/522, 508, 276, 280, 379, 380

[56] References Cited

U.S. PATENT DOCUMENTS

| | | | |
|---|---|---|---|
| 1,254,987 | 1/1918 | Cooper . | |
| 1,976,375 | 10/1934 | Smith | 148/11.5 |
| 2,244,608 | 6/1941 | Cooper | 75/138 |
| 3,147,110 | 9/1964 | Foerster | 75/122.5 |
| 3,337,334 | 8/1967 | Fenn et al. | 75/150 |
| 3,506,438 | 4/1970 | Krock et al. | 75/208 |
| 3,548,915 | 12/1970 | Richmond et al. | 164/68 |
| 3,548,948 | 12/1970 | Richmond et al. | 164/68 |
| 3,687,737 | 8/1972 | Krock et al. | 148/2 |
| 4,389,429 | 6/1983 | Soclof | 438/492 |
| 4,561,173 | 12/1985 | Te Velde | 438/619 |
| 5,324,683 | 6/1994 | Fitch et al. | 437/65 |
| 5,324,684 | 6/1994 | Kermani et al. | 437/95 |
| 5,336,914 | 8/1994 | Andoh | 257/379 |
| 5,408,742 | 4/1995 | Zaidel et al. | 29/846 |
| 5,444,015 | 8/1995 | Aitken et al. | 437/182 |
| 5,457,344 | 10/1995 | Bartelink | 257/522 |
| 5,510,645 | 4/1996 | Fitch et al. | 257/522 |
| 5,578,146 | 11/1996 | Grant et al. | 148/437 |
| 5,725,689 | 3/1998 | Nishida et al. | 148/320 |

OTHER PUBLICATIONS

Wolf, S., "Chapter 4: Multilevel–Interconnect Technology for VLSI and ULSI", In:*Silicon Processing for the VLSI Era. vol. 2 Process Integration*, Lattice Press, Sunset Beach, CA, 176–297,(1990).

Dudzinski, N., et al., "The Youngs Modulus of Some Aluminim Alloys", *J. Institute of Metals, vol. LXXIV*, pp. 291–314, (1947–48).

Singer, F.L., *Strength of Materials*, Harper & Brothers, 229–32, (1951).

*Primary Examiner*—Wael M. Fahmy
*Assistant Examiner*—Hung Van Duong
*Attorney, Agent, or Firm*—Schwegman, Lundberg Woessner & Kluth P.A.

[57] ABSTRACT

A process of manufacturing integrated circuits is disclosed for designing and implementing a hierarchical wiring system. The interconnection requirements are sorted and designed into a particular wiring level according to length. Support structures may be constructed to allow more flexibility in designing air bridge dimensions. The support structures may take the form of lateral ribs or intermediate posts, and may be fabricated of either insulating or conductive material. One integrated circuit described is a memory device, such as a dynamic random access memory.

7 Claims, 12 Drawing Sheets

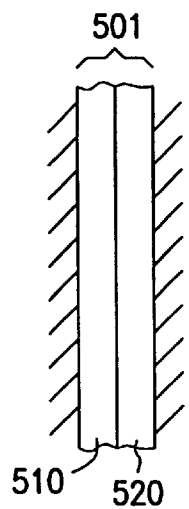
FIG. 5A
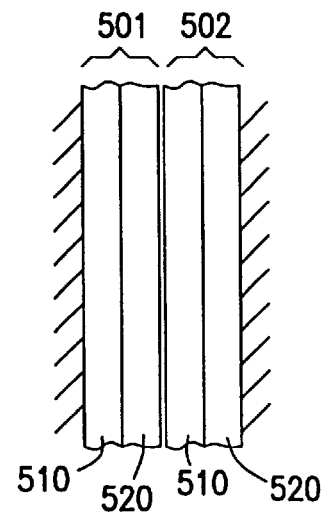
FIG. 5B
FIG. 6A
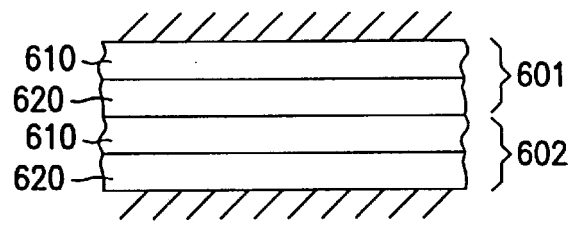
FIG. 6B
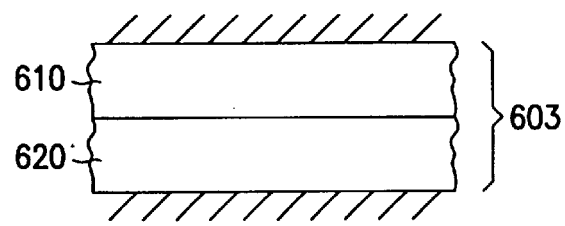
FIG. 6C
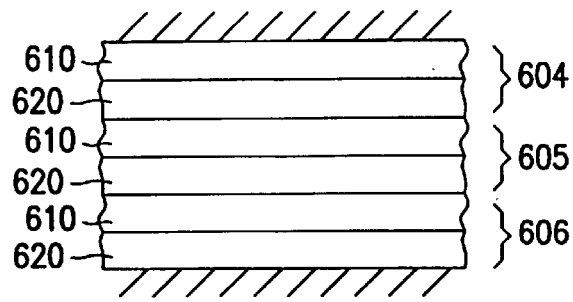

METHOD AND SUPPORT STRUCTURE FOR AIR BRIDGE WIRING OF AN INTEGRATED CIRCUIT

This application is a divisional of U.S. Ser. No. 08/954, 450 filed Oct. 20, 1997, now U.S. Pat. No. 5,891,797, issued Apr. 6, 1999.

FIELD OF THE INVENTION

The present invention relates in general to fabricating semiconductor devices, and particularly to fabricating integrated circuit wiring systems.

BACKGROUND OF THE INVENTION

The continued advance of semiconductor technology creates challenging paradoxes. For example, one improvement that has been seen is the reduction in the size of devices incorporated in integrated circuits, while another is the increasing variety and scope of functions designed into integrated circuits. One common effect of the combination of such advances is an increase in both device density and the overall size of integrated circuits. Both effects engender a corresponding increase in the amount of wiring required to interconnect the devices on a given chip. This creates several problems associated with the wiring requirements. One problem is the extent of available die real estate that must be dedicated to the wiring interconnecting the devices. Another problem is the increasing distances between devices.

Experience has shown that one result of increased device density is a corresponding increase in the area of the chip covered by the metal wiring interconnecting those devices. In one example 90% of the surface area of a 0.29 $cm^2$ chip having 1500 gates is taken up by the wiring metal. The increased density results in reduced spacing between conductive materials, creating a higher risk of capacitive loading. "Capacitive loading" refers to the situation where capacitance between adjacent metal lines is high and a voltage on one of the lines alters the voltage on the other line. The result is a circuit which incorrectly processes information. Capacitive loading is traditionally controlled through maintaining a minimum distance between charge-carrying lines and using resistive materials as spacers between adjacent lines.

In conventional single-level circuit fabrication methods wiring between devices is laid out in straight lines running in either an x- or a y-direction. As the number of devices to be connected increases, connections between any two devices are often longer than the straight line distance between the devices in order to avoid interference between lines connecting other devices. In addition, efficient use of the available space dictates proximal location of a number of the lines to each other, increasing the risk of capacitive loading effects.

One partial solution to the space limitation problem has been to design and fabricate chips with multiple levels for interconnections (see, for example, Stanley Wolf, *Silicon Processing for the VLSI Era*, Volume 2, 1986, pages 176 and following). Designing a chip as a multi-level device allows a certain percentage of the wiring to be distributed at different wiring levels. However, longer interconnects require thicker wires to keep resistance to a manageable level. Thicker wires, however, exacerbate the problem of reduced separation of conductors at the same or adjoining wiring levels. In an attempt to ameliorate the effects of long interconnects and increased device densities, one partial solution has been developed wherein some portion of the interconnect lines are isolated from surrounding levels by an air region. One such structure is an air bridge, which is fabricated such that the interconnect line is suspended, being completely surrounded by air for some portion of its length. Air regions are formed to provide improved dielectric isolation of adjacent dielectric layers and air-isolated conductive interconnects. One method for fabricating such structures is described in U.S. Pat. No. 5,324,684, issued to Fitch at al. In conventional processing air regions are formed by selectively removing a sacrificial spacer or layer.

The benefits realized from implementing air regions are limited, however, by certain physical aspects of the air bridge. As the minimum photo dimensions are decreased, the thickness of both the metal and inter-level air insulator must decrease proportionately. Where a wire is suspended in an air region the thinner metal has a greater propensity to sag because it is less rigid. The maximum allowable sag decreases with reduced photo dimensions, however, as it is a function of the inter-level distance. As a result, the maximum length of the air bridge free span will also decrease.

There is often a need to construct air bridges with a clear span of well over 1 centimeter, but conventional photo ground rules limit bridge length. This constraint drastically reduces the wire-ability of circuits being formed. Even air bridges built to the minimum photo ground rules are limited in length due to mechanical limitations and the effects of resistivity. There remains a need for a procedure to obtain high density air-bridge connections over extended distances (over I cm) in the same structure.

There is, in general, one of two types of integrated circuit design rules employed in order to ensure the maximum distance between two points to be connected by an air bridge is always less than the maximum allowable distance. In the first type of design rule, the bridge constraints are established first and then the devices to be connected are positioned according to those constraints. For example, a maximum bridge distance can be established by determining the wiring and air insulation dimensions and setting an appropriate safety factor for the wire sag. Layout rules are then set to constrain the design so that any two points which must be connected are always closer than the calculated maximum bridge distance. The second type of design rule works from the other direction, first positioning devices and then designing air bridge dimensions to meet the maximum distance and sag safety factor requirements. From that information air bridge fabrication parameters such as wire and insulator thickness necessary for each level of interconnect can be identified. Both of these approaches are limited in their effectiveness, however, because they only determine the air bridge characteristics for the worst-case scenario. In either approach, all air bridges for a given integrated circuit are designed to meet the maximum distance requirements. This may unnecessarily limit the performance of a circuit which requires only a few long bridges and has a majority of short bridges. What is needed is a way to better match air bridge fabrication parameters with the circuit requirements.

SUMMARY OF THE INVENTION

The above mentioned problems with integrated circuits and other problems are addressed by the present invention and which will be understood by reading and studying the following specification. A conductive bridge structure is described which includes intermediate supports.

In particular, the present invention describes a method of manufacturing an integrated circuit is described. The method comprises the steps of preparing a base surface, and forming a first conductor bridge level. The bridge is fabricated by the steps of depositing a first non-conductive material layer on the base surface, forming first supports by removing portions of the non-conductive material layer, and depositing a filler material in the removed portions of the non-conductive material. A first conductive material is deposited over the first non-conductive material layer, and first conductors are formed from the first conductive material such that a conductor intersects with one of the first supports. Finally, an air region is formed around the interconnects by removing the filler material, whereby the first supports remain to provide structural support for the first conductors.

In another embodiment, an integrated circuit comprises an electrical conductor bridge vertically positioned above a base layer. The conductor bridge electrically connects two integrated circuit locations and has a horizontal span between the two integrated circuit locations. An intermediate support is located under the conductor bridge along the horizontal span for vertically supporting the conductor bridge.

In another embodiment, an integrated circuit comprises a first electrical conductor bridge vertically positioned in a first horizontal plane above a base layer. The first conductor bridge electrically connects two integrated circuit locations and has a horizontal span between the two integrated circuit locations. A first intermediate support is located under the first conductor bridge along the horizontal span for vertically supporting the conductor bridge. A second electrical conductor bridge is vertically positioned in a second horizontal plane above the base layer and the first horizontal plane. The second conductor bridge electrically connects two integrated circuit locations and has a horizontal span between the two integrated circuit locations. A second intermediate support located under the second conductor bridge along the horizontal span for vertically supporting the conductor bridge.

A method of fabricating a conductive bridge in an integrated circuit is also described. The method comprises the steps of depositing a layer of insulating material on a base of the integrated circuit, removing portions of the insulating material to define a bridge support, and depositing a filler material to replace the removed portions of the insulating material. The method also comprises removing portions of the filler material to define bridge contact openings, depositing a conductive material over the insulating and filler materials, and into the bridge contact openings, patterning the conductive material to form a conductor and electrical contacts, and removing the filler material under the conductor to form a conductive bridge supported by the contacts and the bridge support.

Yet another method of fabricating a conductive bridge in an integrated circuit is described. The method comprises the steps of depositing a layer of filler material on a base of the integrated circuit, removing portions of the filler material to define a bridge support opening and bridge contact openings, and depositing a conductive material over the filler material, and into the bridge support opening and bridge contact openings. The conductive material is patterned to form a conductor, support and electrical contacts. Finally, the filler material under the conductor is removed to form a conductive bridge supported by the contacts and the bridge support.

BRIEF DESCRIPTION OF THE DRAWINGS

FIG. 5A shows a channel according to one embodiment of the present invention.

FIG. 5B shows the alignment of adjacent channels according to one embodiment of the present invention.

FIG. 6A illustrates an interconnection fabricated using adjacent single bridge structures according to one embodiment of the present invention.

FIG. 6B illustrates a double bridge fabricated according to one embodiment of the present invention.

FIG. 6C illustrates a double bridge fabricated according to another embodiment of the present invention.

DETAILED DESCRIPTION OF THE PREFERRED EMBODIMENTS

Figure 1:
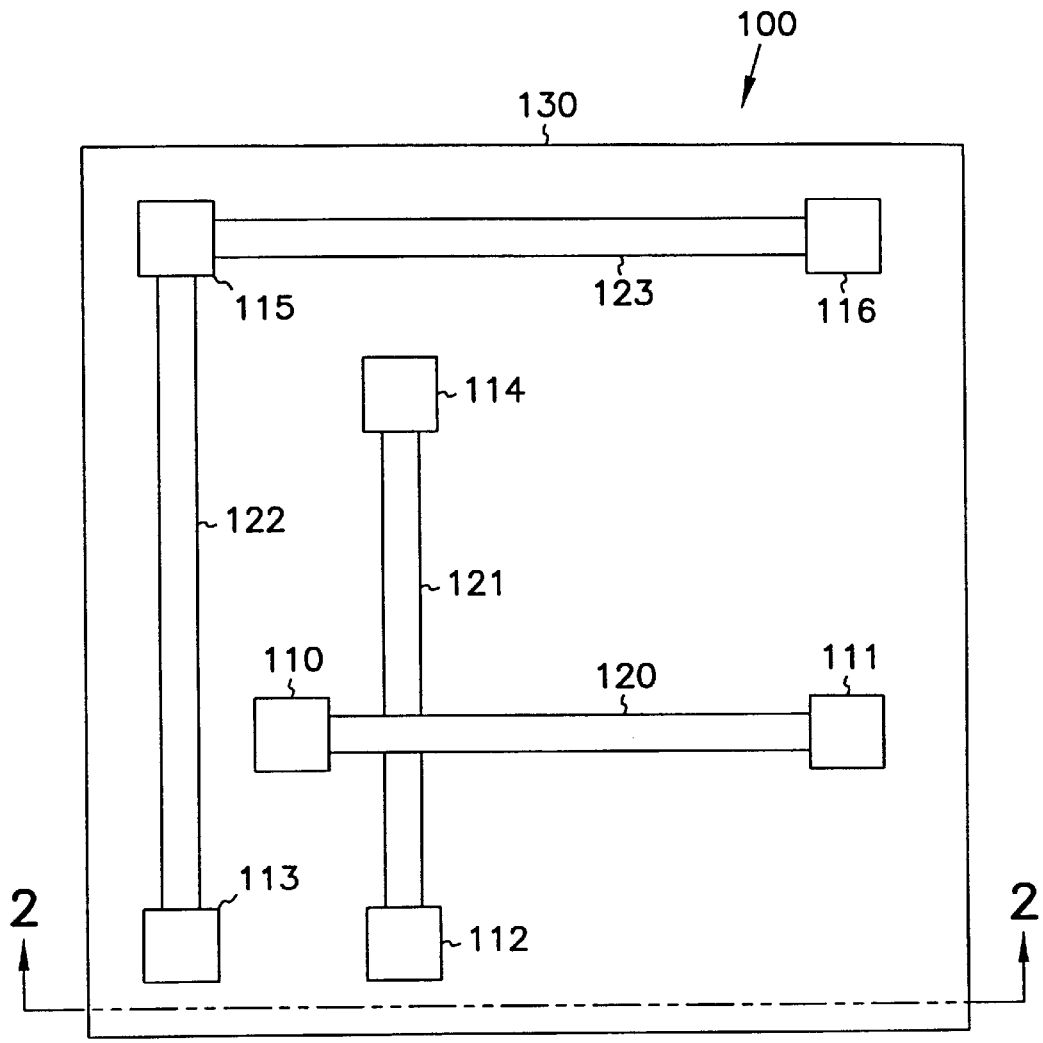
FIG. 1 shows a top view of a simple integrated circuit 100 fabricated as a multi-level device according to one embodiment of the present invention.

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

To increase the use of wiring air bridges in an integrated circuit, support structures are described herein. These support structures allow the length of a wiring bridge to be increased. Air bridge structures can be fabricated to occupy different heights. Thus, single and multiple air bridge structures are described. Further, methods of selecting in which layer an air bridge should be fabricated are disclosed.

GENERAL CONSIDERATIONS AND DEFINITIONS

The following are general considerations and definitions relating to the present invention. For visualization purposes, a conductor between two devices can be illustrated as a "channel". FIG. 5A shows a simple channel 501 defined as a conductive interconnection 510 and a space 520 on one side of the interconnection. As shown in FIG. 5B, adjacent channels 501, 502 are aligned such that the interconnection 510 is on the same side of each channel, effectively separating each interconnect from its neighbor by the width of the associated space 520 in the channel. Where capacitive loading is a concern, the space 520 is designed wider. If resistance or current-carrying capacity is a concern, the line 510 is made wider. The dimensions of the channel 501, 502, are defined according to the design rules controlling fabrication. The size of the space (and the material used as a spacer) determines capacitive loading between adjacent lines. The size of the line is established in view of such factors as current capacity and resistance of the line. One example of a channel fabricated according to the present invention is an air bridge, wherein the channel 501 comprises a trench in which a conductive line 510 is suspended along one side of the trench, and the space 520 is air.

In certain circumstances a double or triple bridge structure may be employed. As the name suggests, a double bridge is twice as a wide, and a triple bridge three times as wide, as a single bridge structure. FIG. 6A illustrates an interconnection fabricated using adjacent single bridge structures 601, 602. In the example shown in FIG. 6B, a double bridge 603 comprises one conductor 610 and one space 620 in the area required for the two single bridges shown in FIG. 6A under the applicable design rules, thereby creating a single conductive line with significantly larger physical dimensions (and an equally-expanded insulating space). In another example shown in FIG. 6C, a double bridge is used to fabricate three smaller conductive lines 604, 605, 606 in the space normally required by two lines, thereby making the wiring design more efficient. In a further example (not shown), a triple bridge provides for the use of lines and spaces varying from the design rules. This enables the fabrication of special-purpose interconnections allowing a more efficient use of space, without changing the underlying channel design dimensions.

As devices become smaller and faster, line resistance becomes a more significant portion of system delay. If, for example, the maximum resistance allowed is 50 Ω per connection, then the usable length of the air-bridge structures would be reduced in a number of instances. Table 1 gives the maximum useable length of air bridges under different circumstances. As illustrated by the data presented in Table 1, an air bridge with a 0.25×0.25 micron cross section has a maximum usable length of only 62 microns or about 250 minimum ground-rule dimensions. If multiple channels are used in a double or triple bridge scheme, the usable length is extended to about 500 or 750 microns, respectively.

TABLE 1

Maximum Air Bridge Usable Lengths

| Wiring Level | Wiring Thickness Microns | Wiring Width Microns | Maximum Bridge Length mm 50 Ω Rest. | Maximum Double Bridge Length mm 50 Ω Rest. | Maximum Triple Bridge Length mm 50 Ω Rest. | Maximum Bridge Length mm |
|---|---|---|---|---|---|---|
| 1 | .25 | .25 | 0.062 | 0.125 | 0.188 | 0.6 |
| 2 | .25 | .25 | 0.062 | 0.125 | 0.188 | 0.6 |
| 3 | .5 | .3 | 0.15 | 0.3 | 0.45 | 1.0 |
| 4 | .5 | .3 | 0.15 | 0.3 | 0.45 | 1.0 |
| 5 | 1 | .4 | 0.4 | 0.8 | 1.2 | 1.6 |
| 6 | 1 | .4 | 0.4 | 0.8 | 1.2 | 1.6 |
| 7 | 4 | 1 | 4.0 | 8.0 | 8.2 | 8.2 |
| 8 | 4 | 1 | 4.0 | 8.0 | 8.2 | 8.2 |
| 9 | 8 | 2 | 14 | 14 | 14 | 14 |
| 10 | 8 | 2 | 14 | 14 | 14 | 14 |

It is readily apparent that, if more than approximately one-third of the 0.25 micron bridges were used as double or triple bridges, the effective number of channels would be reduced to less than the 667 per inch achievable in the 0.3×0.5 micron bridge structures.

SINGLE HEIGHT AIR BRIDGE STRUCTURES

Figure 2:
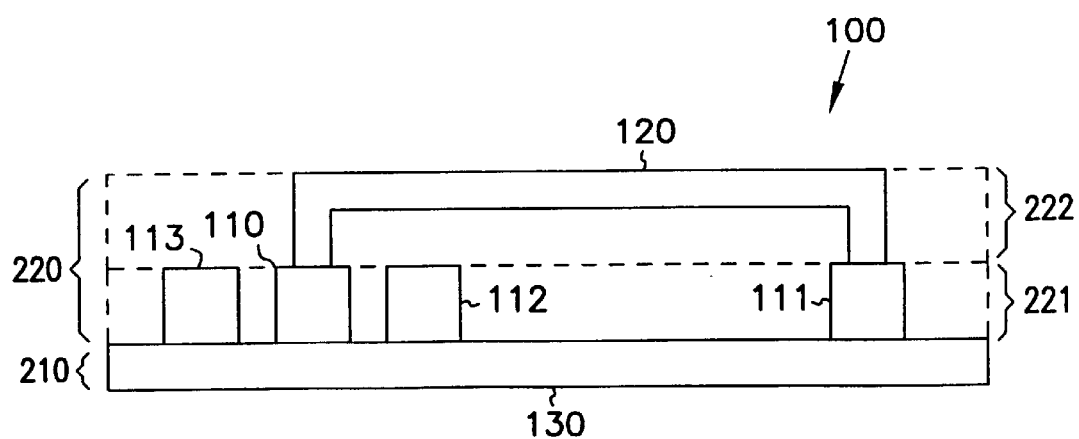
FIG. 2 shows a side cut-away view of the device of FIG. 1 at line 2—2.

FIG. 1 shows a top view of a simple integrated circuit 100 according to one embodiment of the present invention. Fabricating certain of the connections (for example, interconnect bridge 120) in a higher layer addresses two problems. First, the overall connection length can be reduced because more connections can be designed as straight lines. Second, pulling selected lines to a different level leaves more room for the remaining lines, reducing line proximity and capacitive loading between adjacent lines. FIG. 2 shows a side cut-away view of the device of FIG. 1 at line 2—2. As can be seen from FIG. 2, device 100 has a conductive bridge 120 located substantially in level 222, but coupled to contacts 110 and 114 on base 210. Conductor 120 is surrounded by air to form a conductive bridge. Conductors 120, 121, and 123 are located on base 210. Level 222 and level 221 together compose what is referred to herein as a wiring level pair 220 located on base level 210.

Figure 3:
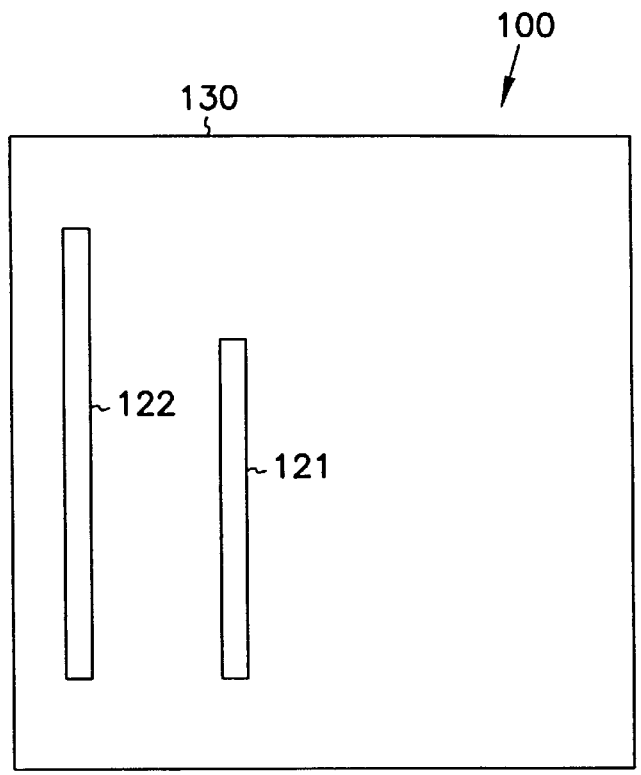
FIG. 3 is a simple schematic of the wiring for the y-direction wiring of the device of FIG. 1.
Figure 4:
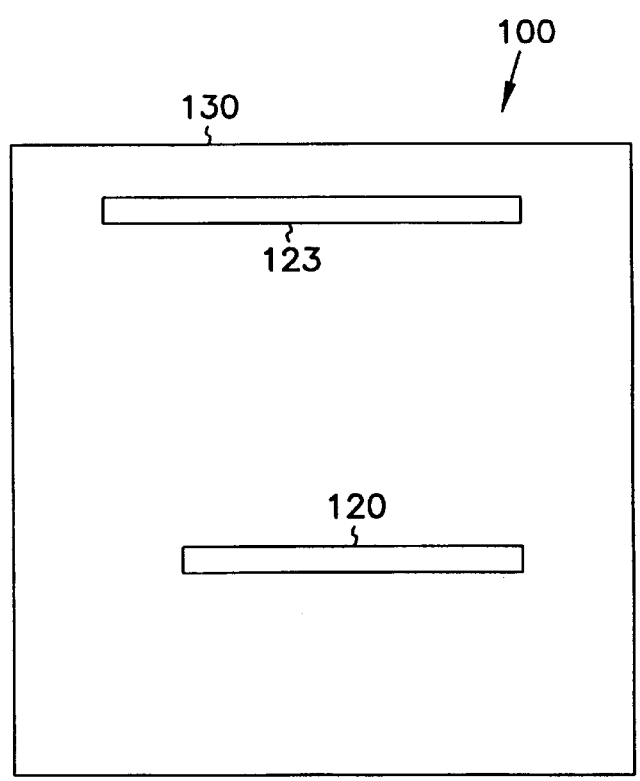
FIG. 4 is a simple schematic of the wiring for the x-direction wiring of the device of FIG. 1.

Level 221 is wired in the y-direction and the level 222 is wired in the x-direction. Having a separate level for each direction reduces the interference between lines and allows shorter connections between more device pairs. FIG. 3 is a simple schematic of the wiring for level 221 (y-direction wiring), and FIG. 4 is a simple schematic of the wiring for level 222 (x-direction wiring). The wiring layouts shown in the Figures are included only as examples and are not intended to be limiting. It is to be noted that the order of wiring levels within a wiring level pair is not significant. One skilled in the art will also recognize that the number of wiring levels and wiring level pairs is flexible, depending in part on the number and length of interconnections to be fabricated in the integrated circuit. For example, a 2 cm by 2 cm chip with ten levels of air-bridge structures could support up to 4.5 km of wiring.

MULTIPLE HEIGHT AIR BRIDGE STRUCTURES

Figure 7:
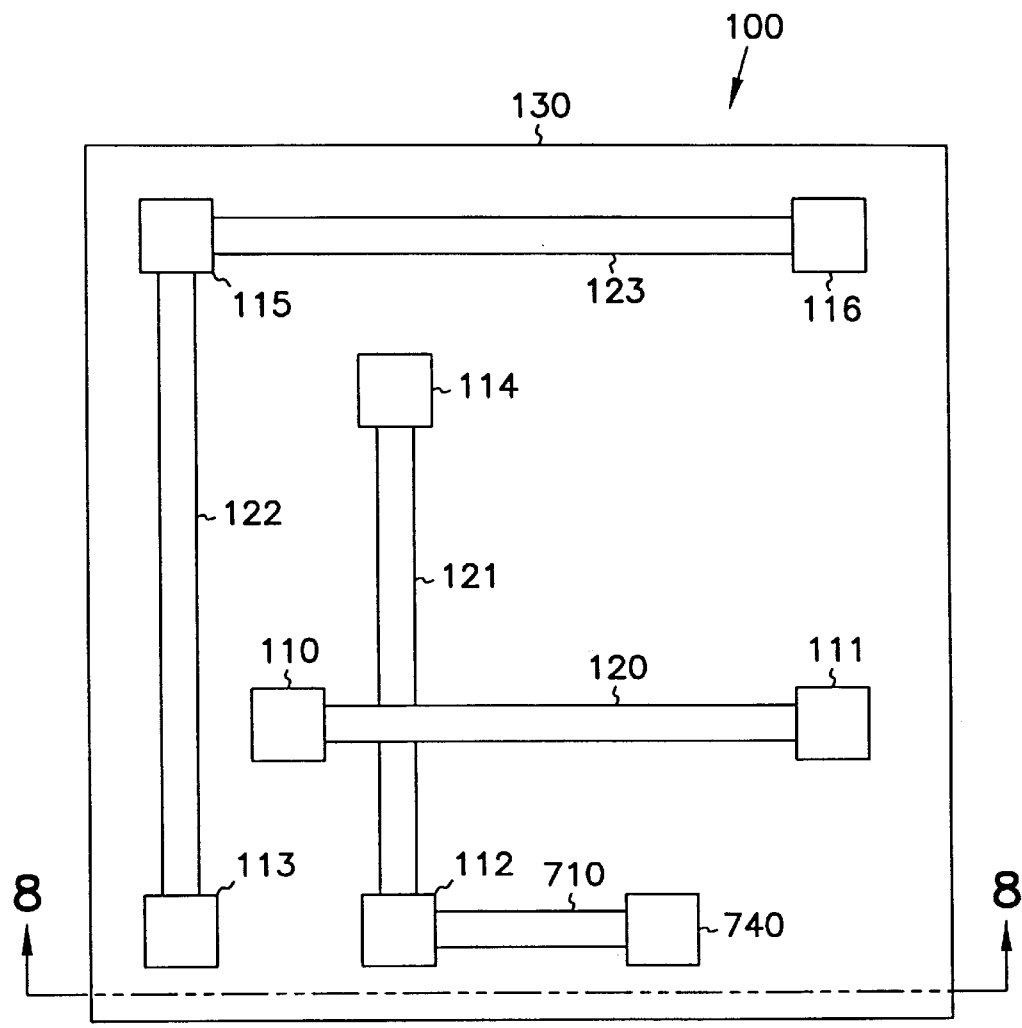
FIG. 7 is a schematic rendering of a top view of a simplified integrated circuit fabricated according to one embodiment of the present invention.

FIG. 7 is a diagram of a top view of the simplified integrated circuit 100 fabricated according to one embodiment of the present invention. Integrated circuit 100 contains several connections 110–116 fabricated on base level 130 using well-known processing techniques. Connections 110–116 are selectively connected by interconnects 120–123, and 710 which include some air bridges. Each air bridge 120, 121, and 710 has a conductor suspended for some portion of its length L in region of air.

Figure 8:
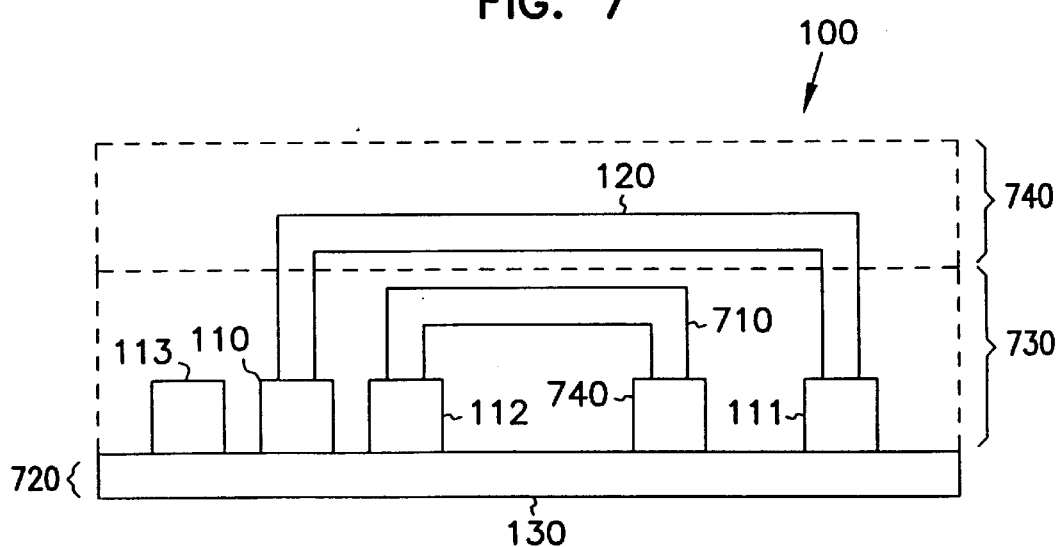
FIG. 8 is a schematic diagram of a cross-section of the air bridge structure shown in FIG. 7.

FIG. 8 is a diagram of a cross-section at line 8—8 of the simplified air bridge structure shown in FIG. 7. According to the example, there are four wiring levels. It can be seen that the wiring levels can be separated into two wiring level pairs 730, 740 above base-level 720. Each wiring level includes air bridges at a specific height. Thus, illustrating a two height air bridge structure.

By changing design rules per level, longer interconnects can be fabricated in the outer wiring levels. Adjusting the design rules according to the length of the interconnects in a wiring level is intended to maintain a consistent level of resistance within the conductive lines as the interconnects increase in length. If this is not a concern, each of the two wiring levels can be designed according to the same design rules (such as bridge geometry boundaries, maximum bridge length, etc.).

As can be seen, each air bridge 120 and 710 shown in FIG. 8 is suspended, and surrounded by air except for where each end attaches to the respective connections 110, 111 and 112, 540. When the interconnect is designed as a free span, the maximum length of the conductor is dependent upon both the amount of elasticity, and sag allowed by given design rules. It will be understood that the relative sizes of the elements of FIGS. 7 and 8 are exaggerated for the sake of illustration.

The maximum unsupported length of an air bridge, for most practical applications in an integrated circuit, can be determined using the following formula:

$$L = \sqrt[4]{32E\delta h^2 / 5p} \text{ or } \approx 1.6(E\delta/p)^{1/4} h^{1/2}$$

In the above formula L is the unsupported bridge length, E is the modulus of elasticity of the bridge alloy, $\delta$ is the maximum allowable deflection of the bridge, p is the density of the bridge alloy and h is the height (vertical thickness) of the bridge.

As minimum photo design dimensions are decreased, both the metal and inter-level air insulator thickness decrease proportionately. The maximum allowable sag also decreases, as it is a function of the inter-level distance. As a result, the maximum length of the air bridge free span decreases. In one example, a bridge is constructed of an aluminum-copper-silicon alloy which has a modulus of elasticity of 71 GPa and a density of 2.79 $Mg/m^3$. The bridge in the example is then used in a structure in which the maximum deflection allowable is 5,000 Å, including an appropriate safety factor, and the thickness h of the bridge metal is 10,000 Å. In this example, then, the maximum unsupported bridge length L would be 1.6 mm. If, however, the maximum allowable deflection is reduced to 2,500 Å and the bridge metal reduced to a thickness h of 5,000 Å, the maximum unsupported bridge length L allowable would drop to 1 mm. If the minimum bridge metal thickness h is further reduced to 2,500 Å and the maximum allowable deflection is limited to 1,500 Å, the maximum allowable length L would be only 0.6 mm.

In addition to making a physical connection with the proper mechanical properties, the electrical properties must also be considered (for example, the resistance cannot be too high). In one example, a 250 micron line made of Al-Cu-Si alloy (which has a resistivity of 50 n$\Omega$m) is at minimum dimensions (0.25 micron) with a square cross section. The resulting line resistance in this case would be 200 $\Omega$. In comparison, a 600 micron line made of the same material and with the same cross section would have a resistance of 480 $\Omega$. It can be seen that although the maximum length of an Al-Cu-Si air bridge with a 0.25 micron cross section would be in the neighborhood of 600 microns, it might not be usable at this length because of its high resistance. As another example, the 10,000 Å thick film with a 4,000 Å width would have a 200 Å resistance at a length of 1.6 mm, while a 0.5 micron thick bridge 0.3 microns wide would have a resistance of about 333 Å at its maximum usable length of 1 mm.

Changing the shape of the air bridge is one method found to reduce the resistance. As an example, a 4 micron thick air bridge with an allowable sag of 3.5 microns would have a maximum allowable length of about 8.2 mm. If the air bridge were constructed so that it had a height to width ratio of 4:1, it would have a resistance of approximately 103 ohms at its maximum usable length. An even thicker air bridge 8 microns high with an allowable sag of 7.5 microns, constructed with a 4 to 1 aspect ratio, would have a resistance of only 44 ohms at its maximum usable length of 1.4 cm. The use of aspect ratios of more than about 4:1 is not particularly desirable, however, because of the capacitive loading caused by neighboring conductors. In addition, the construction of such a tall, skinny structure, although possible, is difficult using most of the processes known to those skilled in the art. In reviewing the information presented above it can be seen that air bridges of over 1 centimeter in length are theoretically feasible, but they will have rather large dimensional requirements relative to the minimum photo ground rules which are now possible. At the minimum photo dimensions achievable, at a given time, it is desirable to have the thickness of the film being etched at about the same thickness as the horizontal dimension. If electroplating or electroless plating is used, in some cases it is possible to produce higher aspect films.

With feature sizes continuing to shrink and chip sizes now well over one centimeter on a side, it is apparent that significant wiring layout problems will be encountered. As a result of shrinking device dimensions the use of conventional air bridge structures is restricted to connecting only those devices within a limited distance of one another. In order to design chips with a reasonably usable size, however, one must have the ability to connect two circuit locations which are more than half-way across the chip. Designs which cannot meet this requirement will not be competitive with others which provide such capability.

When the bridge structure reaches a length approaching one centimeter or more, the mechanical requirements for the bridge may predominate over the electrical requirements in determining the usable length. Restrictions resulting from reduced photo dimensions are overcome through use of multi-bridge structures (such as the double bridge and triple bridge structures described above). Where a long air bridge structure is required, the integrated circuit design rules can be modified to provide an intermediate support structure instead of designing the air bridge as a free span.

AIR BRIDGE SUPPORT STRUCTURES

Figure 9:
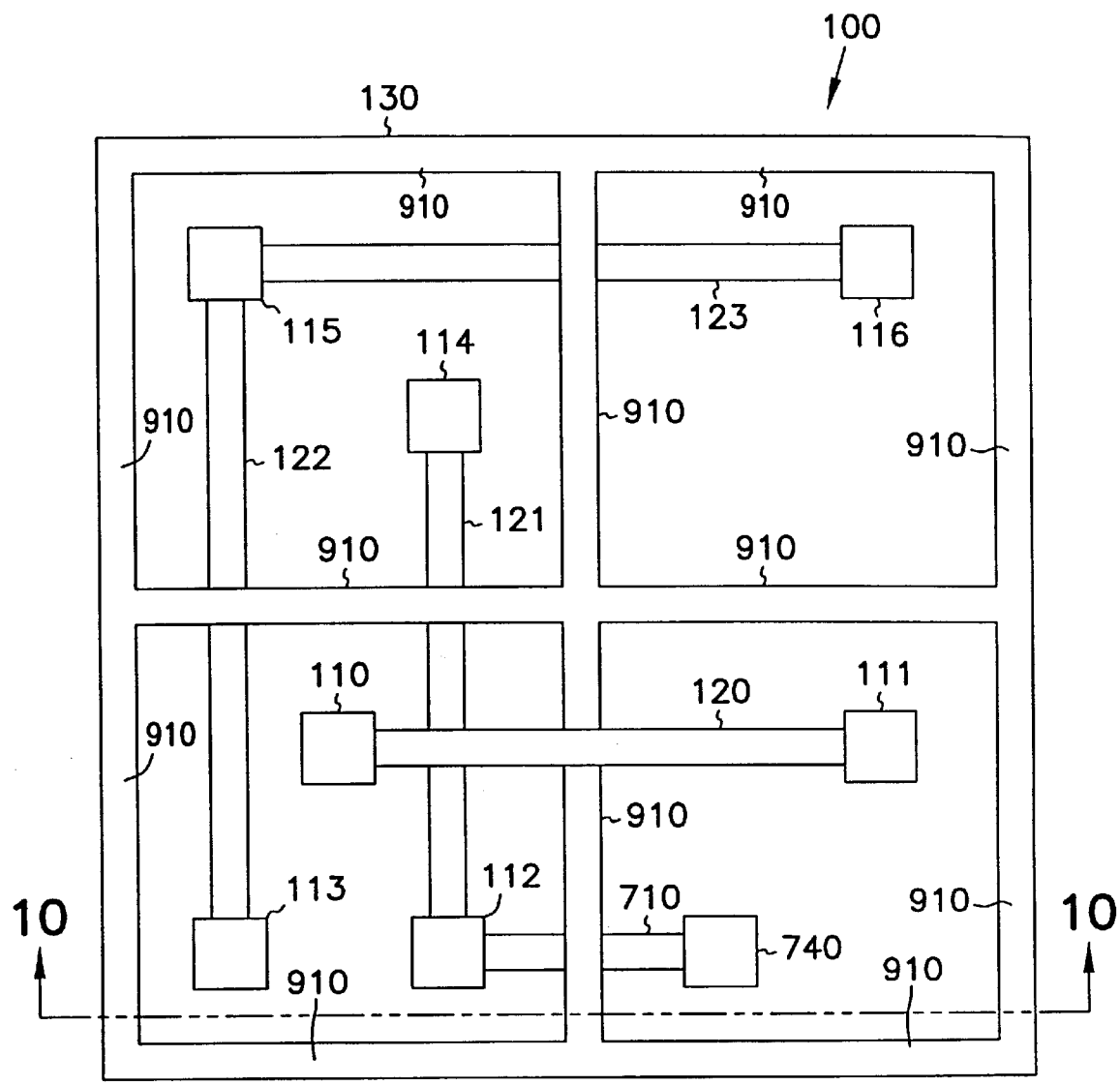
FIG. 9 is a schematic drawing showing a top view of the wiring pattern of FIG. 7 incorporating an intermediate support structure as described in one embodiment of the present invention.
Figure 10:
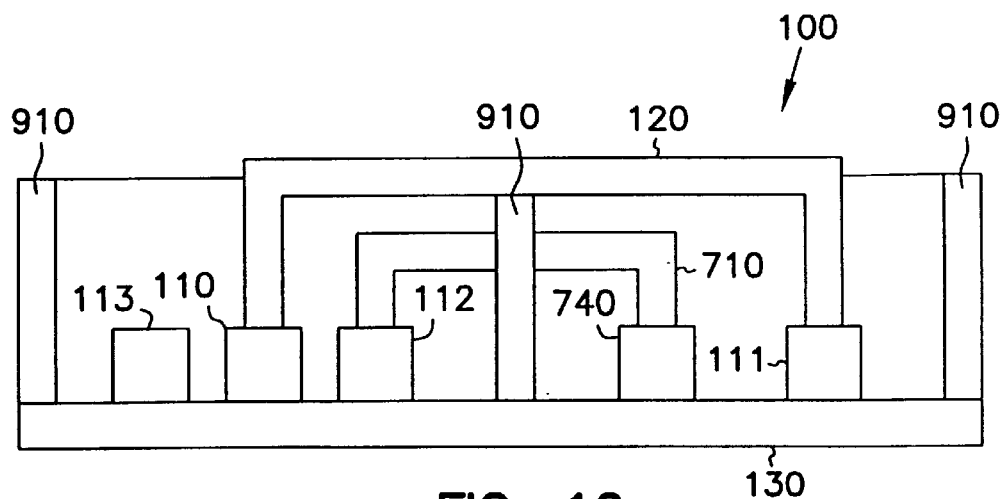
FIG. 10 is a cross-sectional view of the integrated circuit shown in FIG. 9.

FIG. 9 shows a top view of the wiring pattern of FIG. 7 incorporating an intermediate support structure 910. Referring also to FIG. 10, a cross-sectional view is shown along line 10—10 of the integrated circuit 100 of FIG. 9. As can be seen, intermediate support 910 is positioned to minimize the sag of air bridge conductors 120, 121, and 710. When the intermediate support structure is incorporated in the integrated circuit, long air bridges may be used without necessitating any additional constraints on the layout.

The air bridge support structure 910 is constructed such that the outer edges of the structure 910 are located at the edges of the chip. Support structure 910 is fabricated as vertically extending ribs. The outer edges of structure 910, however, can be laterally displaced inward from the edges of the chip. The structure illustrated in FIGS. 9 and 10 has been simplified for the purposes of this discussion. One skilled in the art will recognize that support structure 910 can be designed in a variety of patterns of varying complexity without exceeding the spirit and scope of the present invention.

Ribs 910 are placed so as to support the longest bridge structures. Some or all of ribs 910 may also provide incidental support for shorter structures. Support structure 910 is constructed to a height sufficient to support the topmost wiring level. As shown in FIG. 10, bridges at intermediate wiring levels pass through and are supported by support structure 910. Ribs 910 can be comprised of an insulating material. The insulating material can be, but is not limited to, silicon dioxide. Ribs 910 may also be fabricated from organic, inorganic, or other materials, such as silicon nitride ($Si_3N_4$), various polymers, foams or a mix of organic and inorganic structures, without exceeding the spirit and scope of the present invention.

Figure 11:
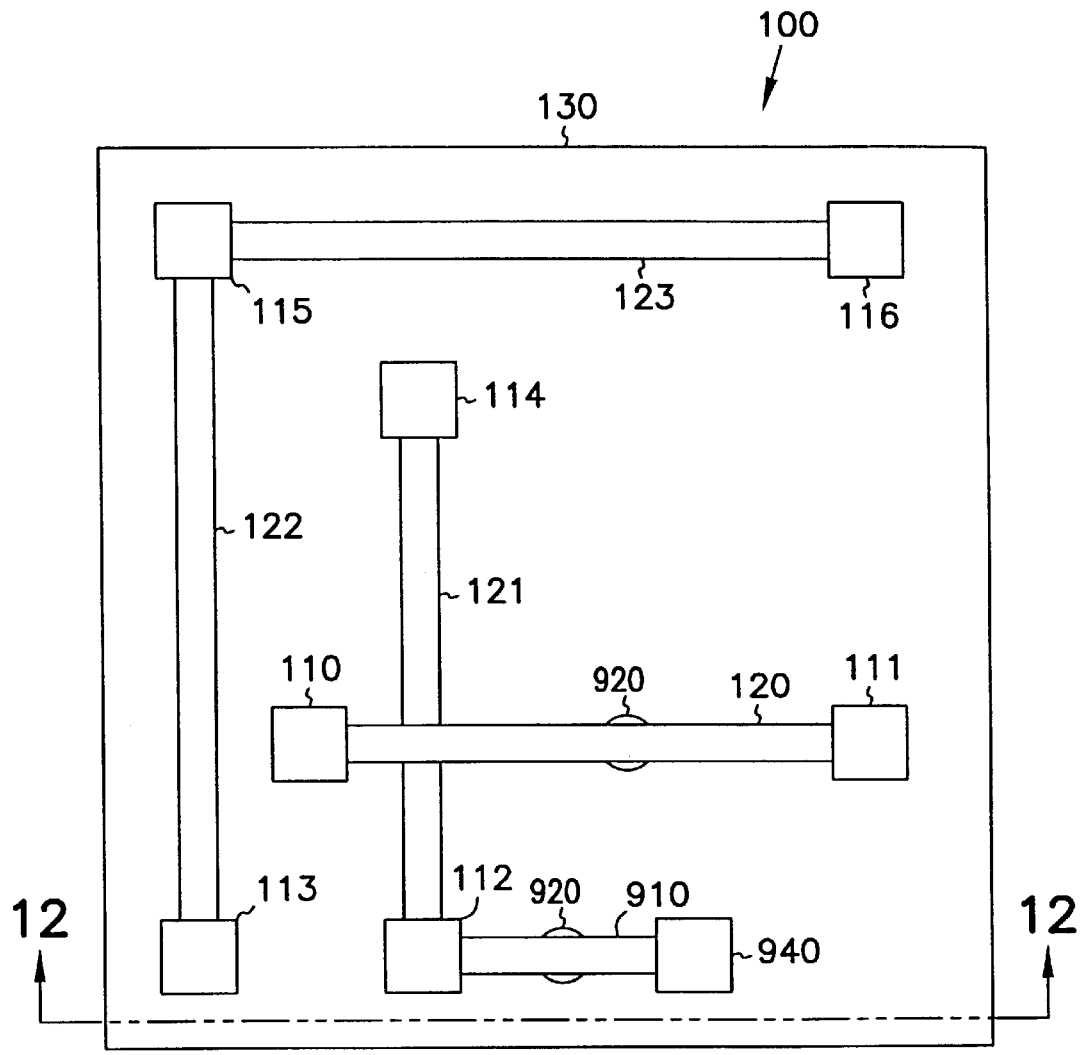
FIG. 11 is a schematic rendering of a top view of an integrated circuit incorporating an air bridge support structure according to one embodiment of the present invention.
Figure 12:
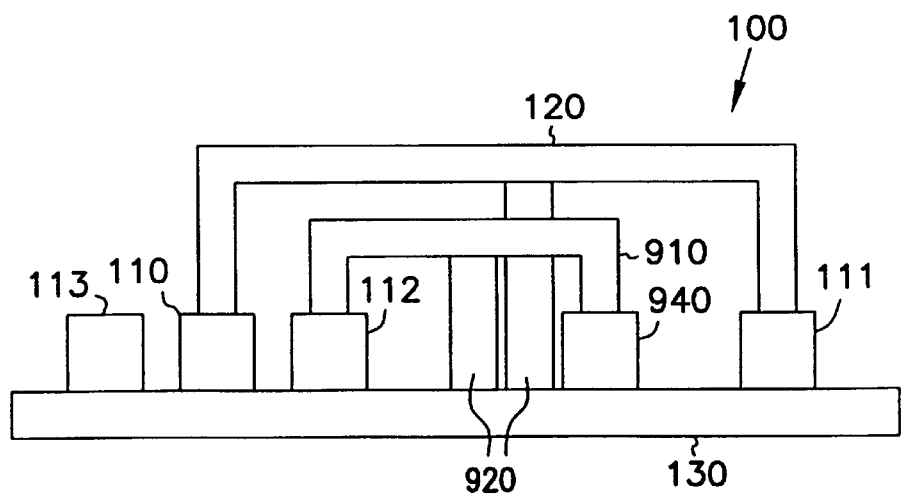
FIG. 12 shows a cross-sectional view of the integrated circuit shown in FIG. 11.
Figure 13A:
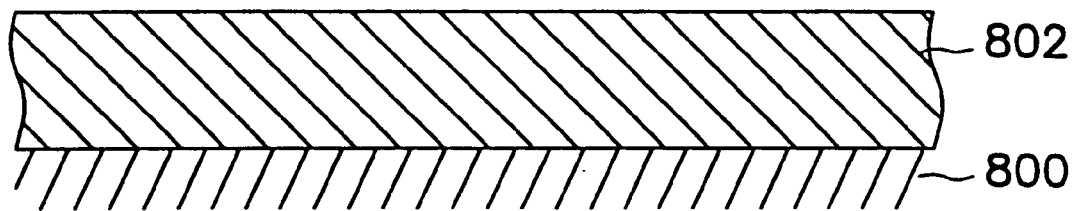
FIGS. 13(a)–(g) illustrate the fabrication of one bridge embodiment.
Figure 13B:
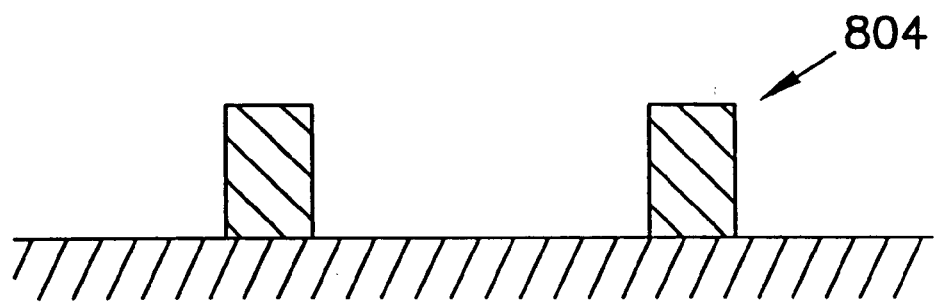
Figure 13C:
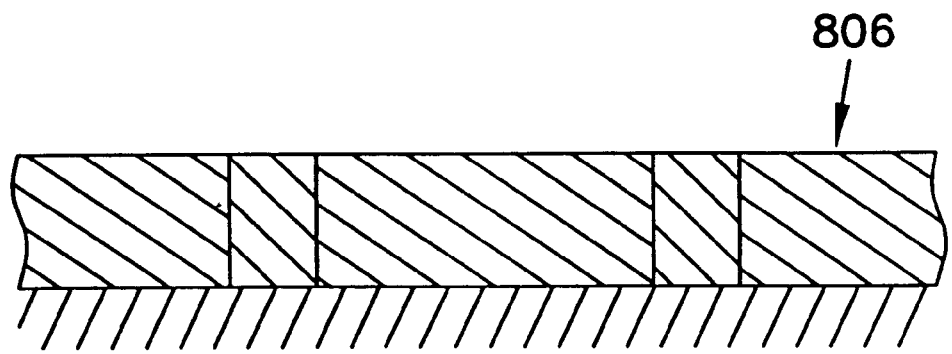
Figure 13D:
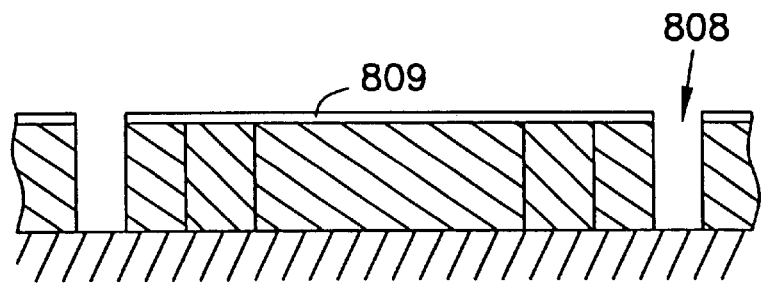
Figure 13E:
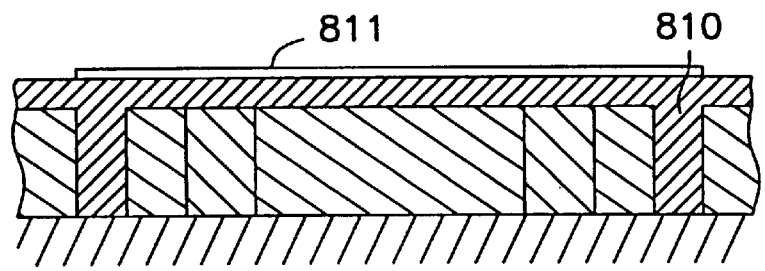
Figure 13F:
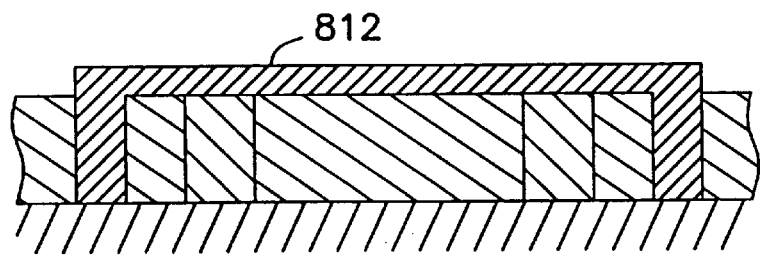
Figure 13G:
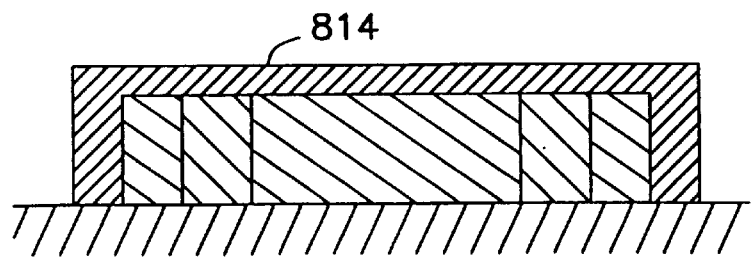

FIG. 11 is a top view of integrated circuit 100 incorporating an air bridge support structure 920 according to another embodiment of the present invention. Support structure 920 comprises a pattern of strategically positioned intermediate posts. The posts 920 can be fabricated from insulating material such as silicon dioxide, or a conductive material with an optional insulated region at the post bottom to insulate the post from the base. Posts 920 can be comprised of the same material as the air bridges 120, 121, 710. FIG. 12 shows a cross-sectional view at line 12—12 of the integrated circuit 100 shown in FIG. 11, showing conductors 120, 121, and 710 as simple air bridge structures incorporating intermediate support structures 920. One skilled in the art will recognize that the intermediate posts 920 may be composed of a variety of materials, including but not limited to silicon nitride, foams or polymers without exceeding the scope and spirit of the present invention. A detailed description of one process of designing an air bridge structure according to the present invention is described below.

AIR BRIDGE DESIGN

One example of design rules for a multi-level air bridge structure is illustrated in Table 2, which shows fabrication parameters for each wiring level of a theoretical 2 cm ×2 cm chip.

TABLE 2

Wiring Structure for a Theoretical 2 cm × 2 cm Chip

| Wiring Level | Wiring Thickness Microns | Wiring Width Microns | Deflection (Sag) Microns | Max. Bridge Length mm | Max. Bridge Rst. ohms | Height Width Ratio | Max. Wire Length Meters | Wiring Pitch Microns |
|---|---|---|---|---|---|---|---|---|
| 1 | .25 | .25 | .15 | 0.6 | 480 | 1 | 800 | .5 |
| 2 | .25 | .25 | .15 | 0.6 | 480 | 1 | 800 | .5 |
| 3 | .5 | .3 | .25 | 1 | 333 | 1.7 | 667 | .6 |
| 4 | .5 | .3 | .25 | 1 | 333 | 1.7 | 667 | .8 |
| 5 | 1 | .4 | .5 | 1.6 | 200 | 2.5 | 500 | .8 |
| 6 | 1 | .4 | .5 | 1.6 | 200 | 2.5 | 500 | 2 |
| 7 | 4 | 1 | 3.5 | 8.2 | 103 | 4 | 200 | 2 |
| 8 | 4 | 1 | 3.5 | 8.2 | 103 | 4 | 200 | 2 |
| 9 | 8 | 2 | 7.5 | 14 | 44 | 4 | 100 | 4 |
| 10 | 8 | 2 | 7.5 | 14 | 44 | 4 | 100 | 4 |

In the design rule example shown, level 1 is closest to the base, or wafer surface and level 10 is farthest from the wafer surface. A wiring plan is developed for each wiring level pair. In contrast, conventional methods develop one wiring plan for the entire device. The same parameters can be applied to each of the x- and y-direction wiring levels making up a wiring level pair.

The first step in creating multiple wiring plans is to identify the required wiring connections for the entire device. The required interconnections are then organized by size, from longest to shortest. Next, the thickness of a metal film forming the conductors and the thickness of the required underlying insulation is determined. This information is used to identify the length and permissible sag of each required clear span to be contained within the current wiring level pair. Using an appropriate height to width ratio, the photo dimensions of the levels can then be determined.

The wiring plan for the first wiring level pair is then developed by connecting as many of the longest lines and most resistance-sensitive nodes as will fit in the first wiring level. The net result is a suitable set of air-bridge dimensions for the first wiring level pair. It should be noted that since only the longest interconnections are wired at this level, the bridges may be designed with a 3:1 or 4:1 aspect ratio in order to reduce resistivity. These then become the upper, outer most pair of the wiring levels. The negative affects of such a high, thin structure have limited impact, and are outweighed by the positive aspects when the number of bridges constructed according to this set of wiring plans is limited to however many fit within one wiring level pair.

A second wiring plan, associated with the wiring level pair next furthest from the base surface, is developed next. Again, the first step is to determine the longest remaining interconnection. It should be noted that, as the maximum length for the second wiring level is less than the minimum length designed for the first wiring plan, the associated constraints (such as the maximum thickness required for each connection and the aspect ratio) will be less than that of the first wiring plan. This information is used to identify the length and permissible sag of each required clear span to be contained within the current wiring level pair. Using an appropriate height to width ratio, the photo dimensions of the levels are then determined. Starting from the longest remaining interconnections, the wiring of the device is continued until the second wiring level pair is full. If the device is not yet completely wired, the process is repeated for the next wiring level pair. As the remaining maximum interconnection is shorter than the channels wired in the previous wiring plans, this third set of air bridges are designed with further reduced constraints (such as a further reduced thickness and aspect ratio) and as a result further reduced photo dimensions.

If the chip cannot be completely wired with three sets of wiring plans, further wiring level pairs can be designed following the same procedure, with further reductions in constraints at each additional level. It should be noted that as the minimum photo dimensions of the photo process are reached and the cross section of the bridge approaches a square (to improve processing), the maximum usable air-bridge length may have too high a resistance. If this is the case, a double or even triple bridge can be used to provide for such as wider interconnects or greater inter-wire spaces (to, for example, further reduce capacitive loading).

The multi-bridge construction enables the designer to use a single set of photo dimensions for each wiring level pair, rather than having to either increase photo dimensions for the entire wiring level pair or use a second set of photo dimensions for special-need interconnects. One skilled in the art will recognize that double or triple-bridge constructs can be used at any wiring level. According to one embodiment of the present invention, each double or triple-bridge is obtained by using a photo image which is larger than the minimum photo dimensions.

Methods are described, as follows, for designing and fabricating air bridges to more closely match the interconnection requirements of an integrated circuit design, thereby maximizing the circuit's performance capabilities. One method for constructing high-density air bridges with long spans is as follows: First, the integrated circuit in question is floor planned. In general, two levels are constructed with the same dimensions, one for wiring in the x-direction and the second for wiring in the y-direction.

Figure 14:
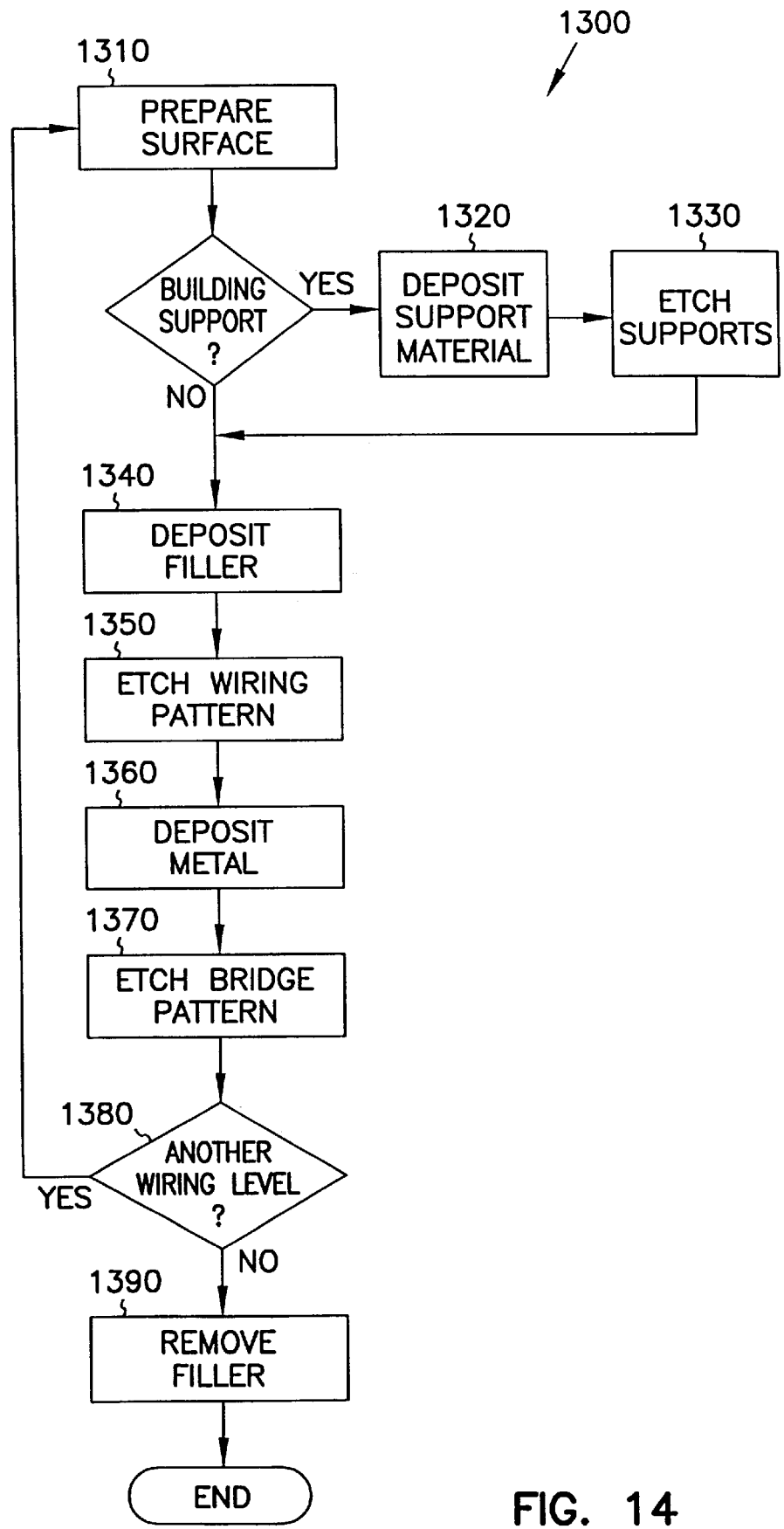
FIG. 14 shows a flow diagram of the process steps corresponding to FIGS. 13(a)–(g).
Figure 15A:
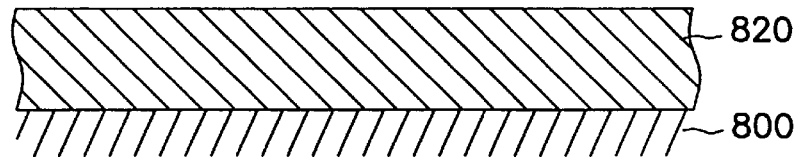
FIGS. 15(a)–(e) illustrate the fabrication of another bridge embodiment.
Figure 15B:
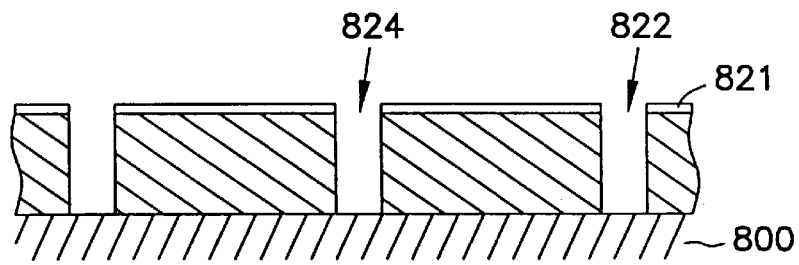
Figure 15C:
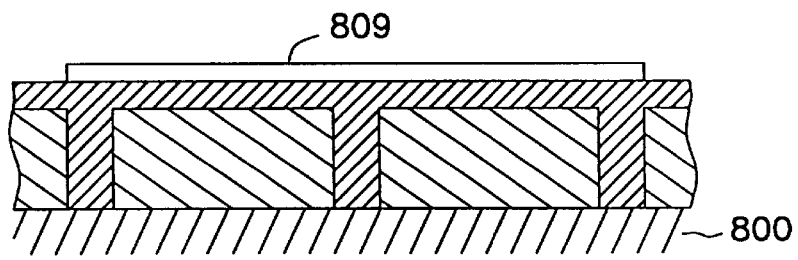
Figure 15D:
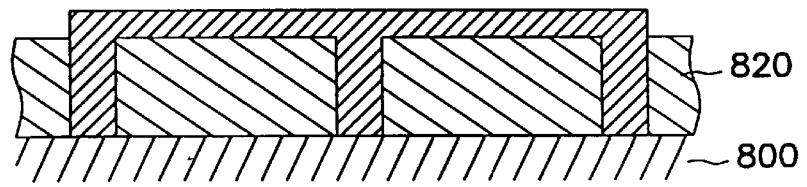
Figure 15E:
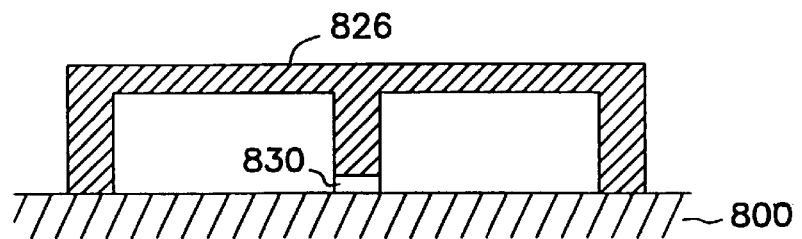

FIGS. 13(a)–(g) illustrate the fabrication of a ribbed or insulating pillar air-bridge support structure. The corresponding flow diagram is provided in FIG. 14. First, (step 1310) the surface of the preceding wiring level is prepared if necessary, using techniques well-known in the art. In the case of the first wiring level, the surface of a wafer substrate 800 is prepared. Then, if a support structure is to be included, the support structure material 802 is deposited (step 1320) to the thickness desired for the associated air-bridge space. Photo resist (not shown) is then applied and, using an appropriate mask and etch, (step 1330) the support structure material is etched away from all areas except where the support structure 804 is intended to repose. A filler 806 (step 1340), such as a high temperature polymer or an inorganic material, is applied to fill the etched areas to a thickness equal to the remaining support structure features 804. The filler surface can be planarized level with the support structure features. Photo resist 809 is then applied and using an appropriate mask and etch process (step 1350) a pattern is etched to form vias 808 for all the vertical wiring between the conductive bridge and the layer upon which it is constructed. Then the resist 809 is removed and metal 810 is deposited (step 1360) in an amount sufficient to fill the openings and to supply a thickness great enough to form the conductors of the current level. The metal surface is planarized if necessary and a photo resist 811 is applied and the conductor pattern for the present wiring level is etched to define conductor 812 (step 1370).

These steps are repeated (step 1380) for each wiring level, with appropriate modifications in thickness to build each succeeding wiring level to the proper height. Upon completion of the final wiring level, the remaining filler 806 is removed (step 1390). If the filler is a high temperature polymer, an appropriate plasma process is performed. If the filler is an inorganic material it is removed by etching. This process leaves the air bridge(s) and support structure(s) in place while providing insulating air spaces. According to one embodiment the support structure is fabricated using $SiO_2$. One skilled in the art will recognize, however, that the support structure may be constructed using materials such as $Si_3N_4$, high temperature polymer (including but not limited to a polyamide), foams, or other organic or inorganic materials without departing from the present invention.

Figure 16:
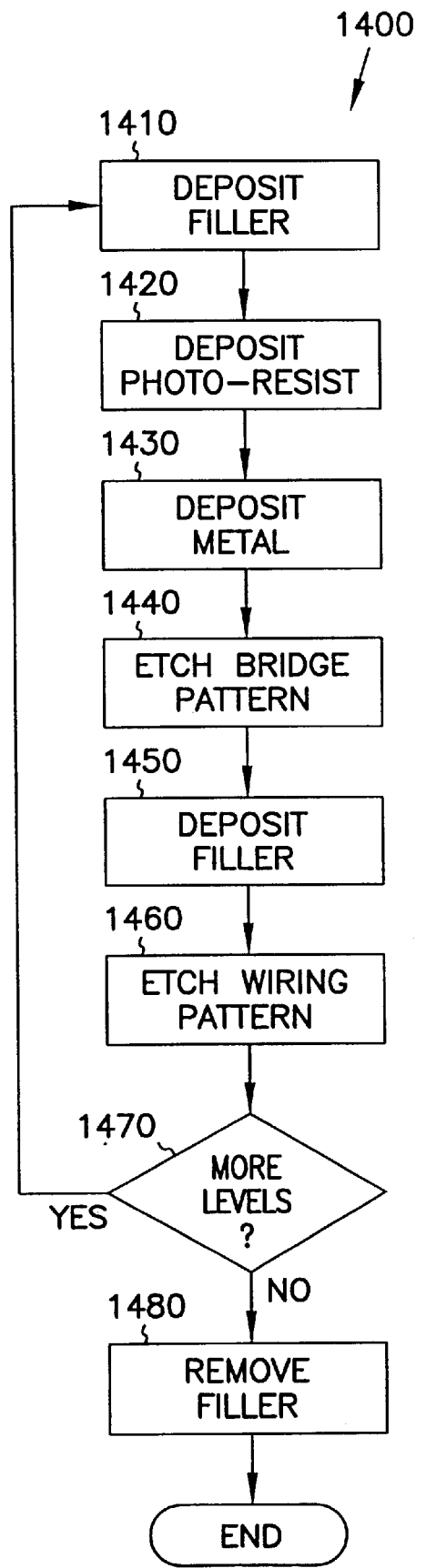
FIG. 16 shows a flow diagram of the process steps corresponding to FIGS. 15(a)–(e).

Another embodiment of the present invention teaches a process to build air-bridge structures without additional support structures or with support structures which are made from the same conductor material as the bridge structures such as Al-Cu-Li alloy, or Al-Cu-Si-Li alloy. FIGS. 15(a)–(e) illustrate the fabrication of this air-bridge, and the corresponding flow diagram is provided in FIG. 16.

A filler 820 is deposited on the previous layer or substrate 800 to a depth equivalent to the space under the current level's air bridge (step 1410). The filler can be $SiO_2$, $Si_{3\,N4}$, or a high temperature polymer such as polyimide. Next, (step 1420) a layer of photo resist 821 is deposited and, using an appropriate mask and etch, the pattern 822 of the current level's vertical wiring is etched. If a conductive support structure is being used, the pattern 824 for that structure is also etched at this point. The resist 821 is removed, and then (step 1430) metal 826 is deposited to fill the holes 822 and 824 etched in the filler. The metal also covers the surface of the filler to the thickness of the desired thickness of the conductors is reached. Next a layer of resist 828 is applied and imaged with the current level's interconnect pattern. The interconnect pattern is then etched at step 1440, and the resist is removed.

A second layer of filler can be applied (step 1450) to build an additional layer. These steps can be repeated (step 1470) for each level until the interconnects are all in place. Then, using the appropriate process (step 1480) the remaining filler 820 is removed, leaving the bridge structures in place. It will be appreciated that insulating islands 830 can be formed to insulate a conductive post from a base layer.

Alternatively, an insulating material, such as a polymer, can be deposited to fill the holes 822 and 824 etched in the filler. This material can then be planerized to a common height with the filler. The filler and/or insulating material is selectively removed from areas where vertical wiring connectors are desired. A metal layer is then deposited to fill the vertical wiring connector areas. The metal covers the surface of the filler to the thickness of the desired thickness of the conductors. The interconnect pattern is then etched.

INTEGRATED CIRCUIT MEMORY

Figure 17:
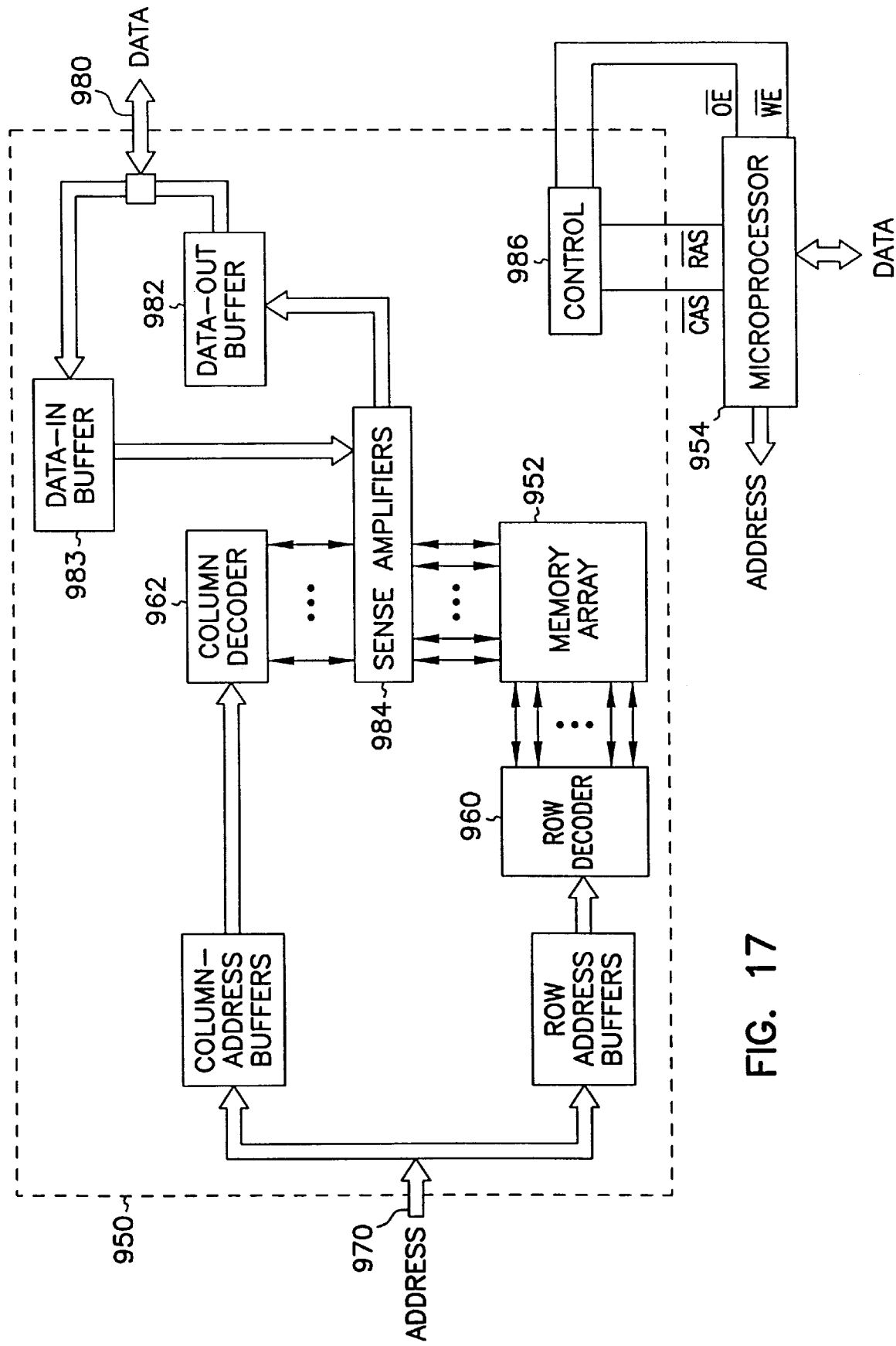
FIG. 17 is a block diagram of a DRAM which incorporates the present invention.

The present invention can be applied to numerous integrated circuits. One integrated circuit which would benefit from the above described methods and structures are memory devices such as a DRAM. A DRAM incorporating the present invention is shown as a functional block diagram in FIG. 17. DRAM 950 has a memory array 952 and associated circuitry for reading from and writing to the memory array. The memory array 952 is arranged in an x-y grid, or rows and columns of memory cells. The DRAM can be accessed by a microprocessor, memory controller, a chip set, or other external system (represented generically as microprocessor 954) through input/output connections including address lines 970. Row decoder 960 decodes a row address from an address signal provided on address lines, and addresses the corresponding row of the memory array 952. Likewise, column decoder 962 decodes a column address from an address signal provided on address lines, and addresses the corresponding column of the memory array 952. Data stored in the memory array can be transferred to outputs 980 through a data output buffer 982. Similarly, data input buffer 983 is used to receive data and transfer the data to the memory. Sense amplifier circuitry 984 is provided to sense and amplify data stored on the individual memory cells of the DRAM array.

Control circuitry 986 is provided to monitor the memory circuit inputs and control reading and writing operations. Output enable (OE*) enables the output buffer of the DRAM. Write enable (WE*) is used to select either a read or write operation when accessing the DRAM. Row address strobe (RAS*) input is used to clock in the row address bits. Column address strobe (CAS*) input is used to clock in the column address bits.

CONCLUSION

A method for fabricating integrated circuits has been described which incorporates air bridges in a hierarchical wiring structure. The interconnects are located within the hierarchy according to length, and design rules are modified for each level of the hierarchy in order to maintain consistent resistance levels, minimize interconnect dimensions, and maximize the use of available die real estate. Double or triple bridge structures may be employed to accommodate special wiring needs. The dimensions of longer air bridges may be reduced by providing support with a structure of vertical ribs or intermediate posts.

Air bridge structures which include intermediate supports have also been described. These supports can be insulating or conductive and formed as pillars or ribs. Insulating islands can be provided as needed to isolate conductive supports.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. An integrated circuit comprising:

an electrical conductor bridge vertically positioned above a base layer, the conductor bridge electrically connecting two integrated circuit locations and having a horizontal span between the two integrated circuit locations;

an intermediate conductive support located under the conductor bridge and above the base layer, wherein the intermediate support vertically supports the conductor bridge; and an electrically insulating region coupled to the intermediate support and disposed between the base layer and the conductor bridge for electrically isolating the base layer from the conductor bridge.

2. The integrated circuit of claim 1 wherein the intermediate support is a column.

3. The integrated circuit of claim 1 wherein the intermediate support is a wall.

4. The integrated circuit of claim 1 wherein the insulating region is proximate to the base layer.

5. A method of fabricating an integrated circuit conductive bridge, wherein the integrated circuit has a base layer, the method comprising:

forming an intermediate support structure above the base layer;

forming at least two conductive bridge support structures on the base layer;

forming an electrical insulating region above the base layer and between the intermediate support and the base layer; and forming a conductive bridge having a horizontal span between the two conductive bridge support structure and further supported by the insulating region and the intermediate support structure such that the conductive bridge is electrically isolated from the base layer via the electrical insulating region.

6. A method of fabricating an integrated circuit conductive bridge, wherein the integrated circuit has a base layer, the method comprising:

forming an intermediate support structure above the base layer;

forming at least two conductive bridge support structures on the base layer;

forming an electrical insulating region above the intermediate support structure; and forming a conductive bridge having a horizontal span between the two conductive bridge support structure and further supported by the insulating region and the intermediate support structure such that the conductive bridge is electrically isolated from the base layer via the electrical insulating region.

7. An integrated circuit comprising:

an electrical conductor bridge vertically positioned above a base layer, the conductor bridge electrically connecting two integrated circuit locations and having a horizontal span between the two integrated circuit locations; and an intermediate support located under the conductor bridge along the horizontal span for vertically supporting the conductor bridge, wherein the intermediate support is fabricated from a conductive material as a vertically extending post further comprising an insulating region disposed between the base layer and the conductor bridge for electrically isolating the conductor bridge from the base layer.

* * * * *